United States Patent [19]
Bergner et al.

[11] Patent Number: 6,080,618
[45] Date of Patent: Jun. 27, 2000

[54] CONTROLLABILITY OF A BURIED DEVICE LAYER

[75] Inventors: Wolfgang Bergner; Johann Alsmeier, both of Wappingers Falls, N.Y.

[73] Assignee: Siemens Aktiengesellschaft, Munich, Germany

[21] Appl. No.: 09/052,683

[22] Filed: Mar. 31, 1998

[51] Int. Cl.[7] ................................................. H01L 2/8242
[52] U.S. Cl. .................... 438/243; 438/244; 438/246; 438/247; 438/386; 438/387; 438/389; 438/390
[58] Field of Search ..................................... 438/243, 244, 438/246, 247, 386, 387, 389, 390

[56] References Cited

U.S. PATENT DOCUMENTS

| | | | |
|---|---|---|---|
| 5,389,559 | 2/1995 | Hsieh et al. | 438/396 |
| 5,395,786 | 3/1995 | Hsu et al. | 438/396 |

*Primary Examiner*—John F. Niebling
*Assistant Examiner*—Jennifer M. Kennedy
*Attorney, Agent, or Firm*—Stanton C. Braden

[57] ABSTRACT

Reduced variations in buried layer across the chip is provided. The reduction in variation is achieved by defining the top surface of the buried layer and then the lower surface of the buried layer. This results in improved control buried strap variations, thereby improving performance of the IC.

26 Claims, 3 Drawing Sheets

CONTROLLABILITY OF A BURIED DEVICE LAYER

FIELD OF THE INVENTION

The invention generally relates to integrated circuits (ICs) and, in particular, to controlling the spatial location of a buried layer in ICs.

BACKGROUND OF THE INVENTION

In semiconductor fabrication, insulating, semiconducting, and conducting layers are deposited and patterned on a substrate to form device structures, such as transistors, capacitors, or resistors. These device structures are then interconnected to achieve a desired electrical function, creating an IC. The production and patterning of the various device layers are achieved using conventional fabrication techniques such as, for example, oxidation, implantation, deposition, epitaxial growth of silicon, lithography and etching. Such techniques are described in S. M. Sze, "VLSI Technology", 2nd ed., New York, McGraw-Hill, 1988, which is herein incorporated by reference for all purposes.

As demand for faster and denser ICs increases, the ability to control the spatial location of buried device layers becomes more important. For example, a buried strap used to couple a transistor to a capacitor to form a dynamic random access memory (DRAM) cell. A minimum buried strap thickness is required, depending on performance and design specifications.

Conventional techniques for forming buried straps includes at least three etch processes. The first etch recesses the polycrystalline (poly) fill and collar that lines the upper portion of the trench capacitor. The second etch further recesses the collar below the poly fill to define the bottom of the buried layer. Poly is deposited to fill the trench and a third etch is performed to recess the poly to define the top of the buried layer. Such techniques produce large variations in buried strap height, for example, of about +/−50 nm. To ensure that the buried strap is at least of the minimum buried strap thickness, the buried strap is at least minimum thickness+|variation|.

The buried strap thickness depends on design requirements. Typically, the thickness is about 100 nm, which would mean that the minimum thickness is 150 nm with a variation in buried strap thickness from 100–200 nm. Such a large variation in buried strap thickness across the IC is undesirable as device performance is adversely impacted. Additionally, such a large variation requires a thicker buried strap, adding process difficulties. For example, its is desirable to have the shallow trench isolation (STI) depth as shallow as possible. However, a thicker buried strap results in the bottom of the buried strap being deeper beneath the substrate surface, requiring a deeper STI.

From the above discussion, an improved buried strap having smaller variations in thickness is desirable.

SUMMARY OF THE INVENTION

The invention relates to improved buried layer formation. The buried layer, serves as a buried strap in a trench capacitor. In accordance with one embodiment, a trench capacitor is provided in a substrate having a dielectric collar lining the upper portion of trench, separating the substrate and semiconducting material, such as doped poly, in the trench. The semiconducting material is recessed, effectively defining the top of the buried strap. The collar is recessed below the top surface of the semiconducting material to form a recess region that surrounds the semiconducting material. The bottom surface of the recess region defines the bottom of the buried strap. A liner material is deposited to fill the recessed region. In one embodiment, the liner comprises silicon. Excess material from the liner is removed, leaving the recessed region filled to the top surface of the buried strap.

DETAILED DESCRIPTION OF THE INVENTION

The present invention relates to improved spatial control of a buried layer. For purposes of illustration, the invention will be described in the context of DRAM cell. However, the invention is significantly broader and extends to the fabrication of ICs in general. The ICs include, for example, include various types memory circuits such as DRAMs, synchronous DRAMs (SDRAMs), static RAMs (SRAMs), or read only memories (ROMs). Also, the ICs may include logic devices such as a programmable logic arrays (PLAs), application specific ICs (ASICs), merged DRAM-logic ICs (embedded DRAMs), or any other circuit devices.

Typically, numerous ICs are fabricated on a substrate, such as a silicon wafer, in parallel. After processing, the wafer is diced in order to separate the ICs into a plurality of individual chips. The chips are then packaged into final products for use in, for example, consumer products such as computer systems, cellular phones, personal digital assistants (PDAs), and other electronic products.

Figure 1:
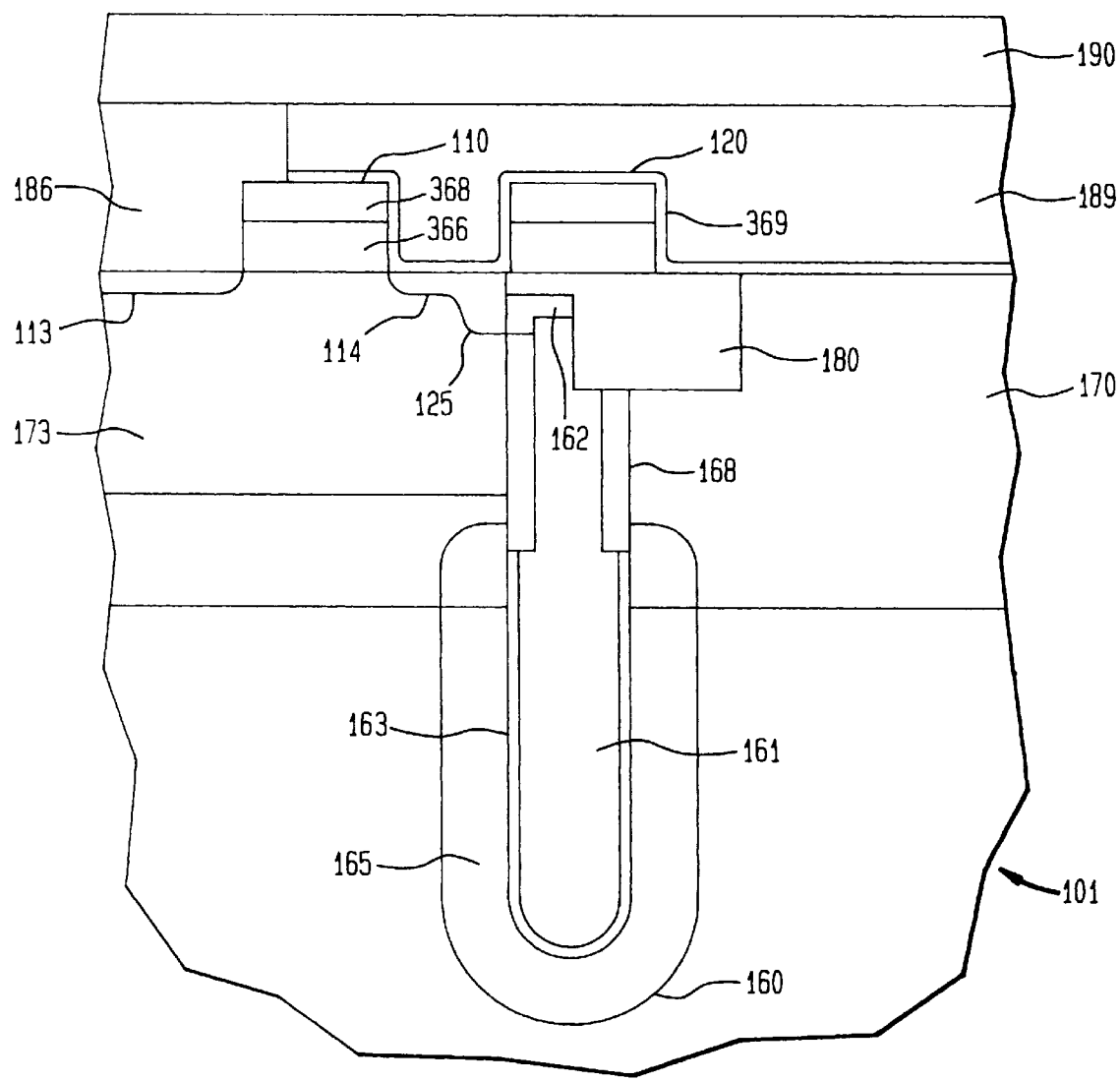
FIG. 1 shows a DRAM cell.

Referring to FIG. 1, a trench capacitor DRAM cell is shown. Such DRAM cell is described in, for example, Nesbit et al., *A 0.6 $\mu m_2$ 256 Mb Trench DRAM Cell With Self-Aligned Buried Strap (BEST)*, IEDM 93–627, which is herein incorporated by reference for all purposes.

As shown, the DRAM cell includes a trench capacitor 160 formed in a substrate 101. The trench is filled with, typically, polysilicon (poly) 161 that is heavily doped with n-dopants. The poly serves as an electrode of the capacitor, is referred to as a "storage node." A buried plate 165 doped with n-type dopants surrounds the lower portion of the trench. The buried plate serves as the second electrode of the capacitor. Lining the inner sidewalls in the upper portion of the trench is a collar 168 for reducing vertical parasitic leakage around the deep trench is provided. Typically, the collar is about 1 nm deep. In the lower portion of the trench, a node dielectric 163 separates the two plates of the capacitor. A buried well 170 comprising n-type dopants is provided to connect the buried plates of the DRAM cells in the array. Above the buried well is a p-well 173. The p-well serves to reduce vertical leakage.

The DRAM cell also comprises a transistor 110. The transistor includes a gate 112 and diffusion regions 113 and 114 comprising n-type dopants. The diffusion regions are referred to as the source and drain. The designation of source and drain depends on the operation of the transistor. Connection of the transistor to the capacitor is achieved via a diffusion region 125, referred to as the "node diffusion." The gate, also referred to as the "wordline," typically comprises poly 366 and nitride 368 layers. Alternatively, layer 366 is a polycide layer which comprises silicide, such as molybdenum ($MoSi_x$), tantalum ($TiSi_x$), tungsten ($WSi_x$), titanium ($TiSi_x$), or cobalt ($CoSi_x$), over a layer of poly to reduce wordline resistance.

In one embodiment, the polycide layer comprises $WSi_x$ over poly. A nitride liner 369 covers the gate stack and substrate. The nitride layer 368 and nitride liner serves as an etch or polish stop layer for subsequent processing.

A shallow trench isolation (STI) 180 is provided to isolate the DRAM cell from other cells or devices. As shown, a wordline 120 is formed over the trench and isolated therefrom by the STI. Wordline 120 is referred to as the "passing wordline." Such configuration is referred to as a folded bitline architecture. Other configurations such as open or open-folded bitline architectures or cell designs are also useful.

An interlevel dielectric layer 189 is formed over the wordlines. A conductive layer, representing a bitline, is formed over the interlevel dielectric layer. A bitline contact 186 is provided in the interlevel dielectric layer to contact the source 113 to the bitline 190.

A plurality of such cells is configured to form an array of a memory IC. The array of cells is interconnected by wordlines and bitlines. Access to a cell is achieved by activating the cell's corresponding wordline and bitline.

Figure 2A:
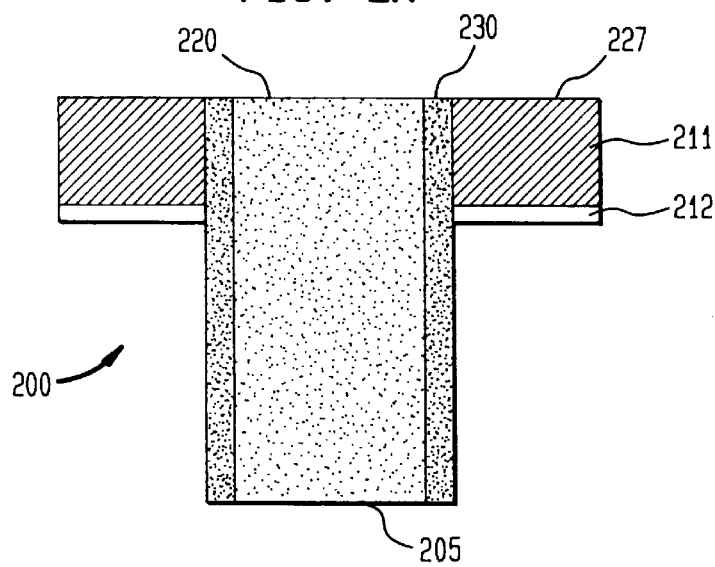
FIGS. 2a–f show an embodiment of the invention.

Referring to FIG. 2a, a cross section of an IC is shown. The IC includes a substrate comprising, for example, silicon. Other semiconductor substrates, such as silicon on insulator or epitaxial are also useful. Substrate 200 has a pad stack formed thereon. The pad stack comprises various layers that serve to facilitate processing of the IC. Typically, the pad stack comprises a pad oxide layer 212 formed by, for example, thermal oxidation. Above the pad oxide is a pad etch stop layer 211. The pad etch stop layer comprises material from which other device layers can be etched or polish selective thereto, thereby facilitating processing of the IC. For example, the etch stop comprises a material that the poly or dielectric collar can be removed selective thereto. In one embodiment, the pad stop layer comprises silicon nitride formed using conventional techniques, including, for example, chemical vapor deposition (CVD) process such as low pressure chemical vapor deposition (LPCVD) or plasma enhanced chemical vapor deposition (PECVD). Other types of etch stop layers are also useful. The pad stack may include an additional layer or layers, such as a hard mask layer (not shown) used for etching the deep trench 205. Typically, the hard mask layer is removed after the formation of the trench.

The substrate includes a partially completed trench capacitor. For purposes of discussion, only the top portion of the trench capacitor is shown. The lower portion may be similar to the trench capacitor shown in FIG. 1. A collar 230 is provided in the upper portion of the trench capacitor, lining the trench sidewalls. The collar comprises, for example, a dielectric material such as oxide formed from tetraethyloxosilane (TEOS). A nitride layer may be provided over the oxide collar to improve collar isolation characteristics. Poly 220 typically is used to fill the trench. The poly, is doped with dopants. In one embodiment, the poly is doped with n-type dopants such as phosphorous (P) or arsenic (As). Alternatively, p-type dopants may be used for p-type array cells. The surface of the substrate is polished selective to the pad stop layer. The polish, which for example comprises a chemical mechanical polish, polishes the poly at a faster rate than the material of the pad layer. Thus the CMP removes the excess poly material from the surface without effectively removing the pad stop layer, producing a planar surface 227.

Figure 2B:
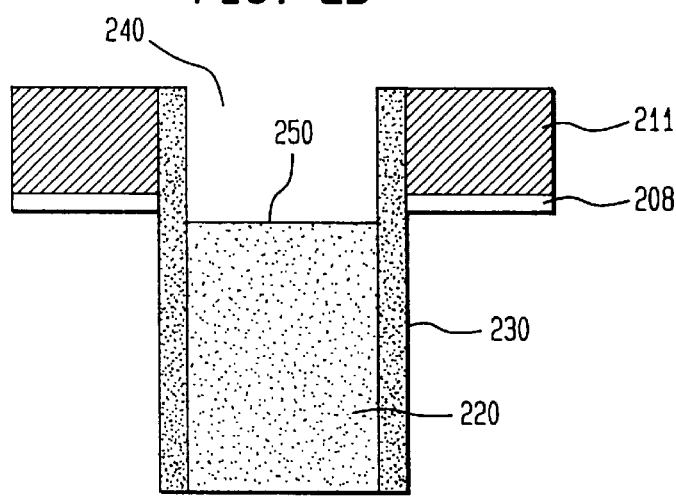

Referring to FIG. 2b, an etch is performed to form a buried layer. The etch, for example, comprises a reactive ion etch (RIE) selective to the pad stop and collar. The etch forms a recessed region 240 below surface 208 of the substrate. In accordance with the invention, the etch recesses the poly in the trench to define a top surface 250 of the buried layer. Although subsequent processing may result in small amounts of materials being removed to further recess the trench, this removal of additional material is negligible. Thus, the etch effectively defines about the top surface of the buried layer. The depth of the top surface of the buried strap depends on design requirements, such as isolation from a device layer located above the trench. For example, in a folded bitline architecture, the passing wordline is located above the trench. The distance between the top of the buried strap and the device layer (typically at the surface of the substrate) should be large enough that the isolation material provides isolation between the two. Typically, the depth of the top surface of the buried strap is about 50 nm. The recess depth, or course, may vary and be optimized for specific applications to achieve the desired electrical characteristics.

Figure 2C:
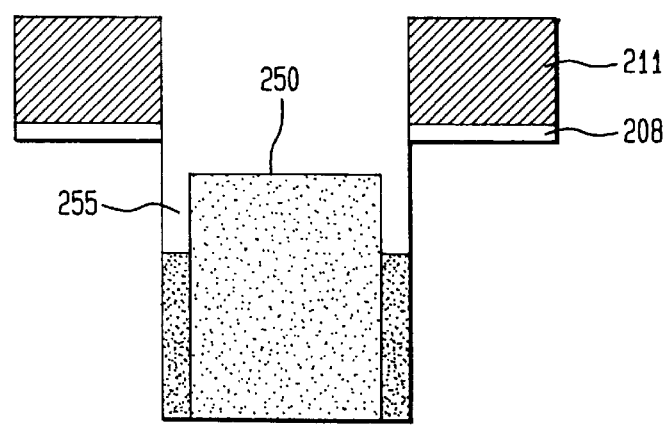

Referring to FIG. 2c, the dielectric collar above surface 250 is removed. Removal of the collar is achieved by, for example, an isotropic etch such as a wet of chemical dry etch. The etch is selective to the pad stop and poly. In accordance with the invention, an over etch is performed to recess the collar below surface 250 to define the bottom of the buried layer. As a result, a recessed region 255 is provided below surface 250 that surrounds the trench. Typically, the over etch recesses the collar to a depth of about 50–100 nm below surface 250 to provide a buried strap layer thickness of about 50–100 nm. Of course the depth of the over etch can vary depending on design requirements, such as resistance.

Figure 2D:
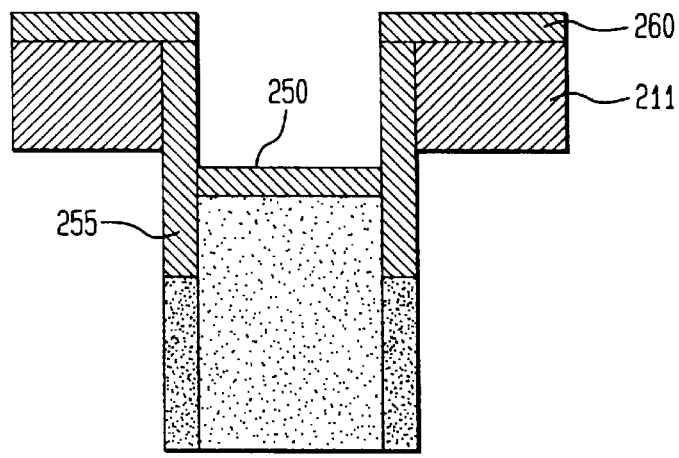

In FIG. 2d, a liner 260 is deposited to cover the surface of the pad stop layer, trench sidewalls, and surface 250. The liner comprises, in one embodiment, undoped silicon such as poly silicon or amorphous silicon. Germanium (Ge), carbon (C) or compounds including Ge—Si or Si—C compounds may also be used to form the liner. The liner is formed by conventional techniques such as, for example, LPCVD.

The liner is sufficiently thick to fill the recessed region 255. The liner thickness depends on the thickness of the collar. The liner is at least half the thickness of the collar. Typically, the collar thickness is about 30 nm. A 20–40 nm thick liner is sufficient to fill the recessed region 255.

Figure 2E:
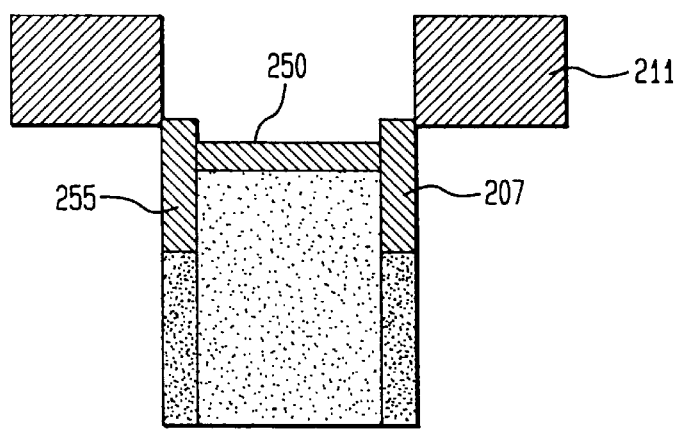

Alternatively, as shown in FIG. 2e, the liner 260 comprises silicon deposited by selective epitaxial techniques. Such techniques are well known and are described in, for example, S. M. Sze, "*VLSI Technology*", 2nd ed., New York, McGraw-Hill, 1988, which is herein incorporated by reference for all purposes. Selective epitaxial techniques advantageously deposit the liner on the trench sidewalls 207 and surface 250, filling recessed region 255.

Figure 2F:
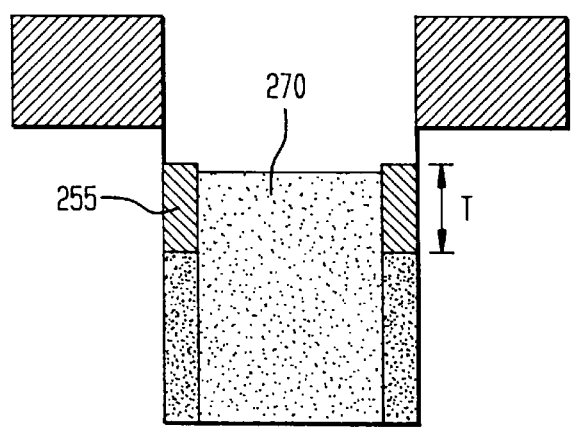

Referring to FIG. 2f, the excess material from the liner is removed, leaving liner material filling region 255. Removal of the excess liner material is achieved using, for example, an isotropic etch such as a wet etch or CDE. As a result, a buried layer 270 having thickness T is created.

In some cases, the epi layer is sufficiently thin such that the excess material lining trench sidewalls 207 and surface 250 are consumed by an thermal oxidation process, leaving recessed region filled with epi. Typically, the epi should be about 20–40 nm thick. This advantageously eliminates the etch used to remove the excess liner material. The oxidation process can either be a separate process or integrated as part of subsequent thermal processes during the fabrication of the IC.

By effectively defining the top of the buried layer first, improved control in its thickness is achieved. This results in improved integration schemes and device performance.

Processing continues to complete the IC. For example, defining the active region, forming a isolation in the non-active region, forming a transistor in the active region, and other processing to produce a DRAM cell as shown in FIG. 1. Interconnects may then be form, creating an IC which is packaged and used in electronic products.

What is claimed is:

1. A method for forming a buried layer within a substrate comprising:

providing a substrate with a trench whose sidewalls are defined by the substrate, wherein the trench is filled with a first semiconductor material and comprises a dielectric collar lining the sidewall in an upper portion of the trench to separate the first semiconductor material from the substrate;

forming a recessed region below the substrate located between the sidewall and the first semiconductor material having an upper surface below a top surface of the substrate, the recessed region having a bottom formed by an upper surface of the dielectric collar and filling the recessed region with a second semiconductor material to form the buried layer therein, the buried layer comprises an upper surface substantially planar with the upper surface of the first semiconductor material.

2. The method of claim 1 wherein forming the recessed region comprises:

recessing the first semiconductor material to a first depth below the surface of the substrate; and recessing the dielectric collar to a second depth below the first depth.

3. The method of claim 1 wherein the buried layer serves as a buried strap of a trench capacitor.

4. The method of claim 3 wherein forming the recessed region comprises:

recessing the first semiconductor material to a first depth below the surface of the substrate; and recessing the dielectric collar to a second depth below the first depth.

5. The method of claim 3 further comprises processing to complete fabrication of the trench capacitor.

6. The method of claim 5 wherein forming the recessed region comprises:

recessing the first semiconductor material to a first depth below the surface of the substrate; and recessing the dielectric collar to a second depth below the first depth.

7. The method of claim 5 further comprises processing to complete fabrication of a memory cell.

8. The method of claim 7 wherein forming the recessed region comprises:

recessing the first semiconductor material to a first depth below the surface of the substrate; and recessing the dielectric collar to a second depth below the first depth.

9. The method of claim 7 further comprises processing to complete an integrated circuit.

10. The method of claim 9 wherein forming the recessed region comprises:

recessing the first semiconductor material to a first depth below the surface of the substrate; and recessing the dielectric collar to a second depth below the first depth.

11. The method of claim 1 further comprises processing to complete an integrated circuit.

12. The method of claim 11 wherein forming the recessed region comprises:

recessing the first semiconductor material to a first depth below the surface of the substrate; and recessing the dielectric collar to a second depth below the first depth.

13. The method of claim 1 wherein filling the recessed region with the second semiconductor material comprises:

depositing the second semiconductor material by chemical vapor deposition, wherein the chemical vapor deposition also forms excess second semiconductor material on the substrate, sidewalls, and upper surface of the first semiconductor material; and removing the excess second semiconductor material to from the buried layer in the recessed region.

14. The method of claim 13 wherein the second semiconductor material comprises undoped poly.

15. The method of claim 14 wherein removing the excess second semiconductor material comprises a wet etch.

16. The method of claim 14 wherein removing the excess second semiconductor material comprises a dry etch.

17. The method of claim 13 wherein the first semiconductor material comprises doped poly.

18. The method of claim 17 wherein removing the excess second semiconductor material comprises a wet etch.

19. The method of claim 17 wherein removing the excess second semiconductor material comprises a dry etch.

20. The method of claim 13 wherein the first second semiconductor material comprises doped poly and the second semiconductor material comprises undoped poly.

21. The method of claim 20 wherein removing the excess second semiconductor material comprises a wet etch.

22. The method of claim 20 wherein removing the excess second semiconductor material comprises a dry etch.

23. The method of claim 1 wherein filling the recessed region with the second semiconductor material comprises:

forming the second semiconductor material by epitaxial growth, wherein the epitaxial growth fills the recessed region and forms excess second semiconductor material on the sidewalls and the upper surface of the first semiconductor material; and oxidizing the excess second semiconductor material to from the buried layer in the recessed region.

24. The method of claim 23 wherein the first semiconductor material comprises doped poly.

25. The method of claim 23 wherein the second semiconductor material comprises silicon.

26. The method of claim 23 wherein the first semiconductor material comprises doped poly and the second semiconductor material comprises silicon.

* * * * *